(12) United States Patent
Guo et al.

(10) Patent No.: US 11,677,126 B2
(45) Date of Patent: Jun. 13, 2023

(54) PHASE SHIFTER AND ANTENNA DEVICE

(71) Applicant: BOE TECHNOLOGY GROUP CO., LTD., Beijing (CN)

(72) Inventors: Jingwen Guo, Beijing (CN); Yanzhao Li, Beijing (CN); Qianhong Wu, Beijing (CN); Chunxin Li, Beijing (CN); Feng Qu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 17/384,934

(22) Filed: Jul. 26, 2021

(65) Prior Publication Data
US 2022/0140458 A1    May 5, 2022

(30) Foreign Application Priority Data

Oct. 30, 2020    (CN) .......................... 202011192784.4

(51) Int. Cl.
  *H01Q 3/36* (2006.01)
  *H01P 1/18* (2006.01)
  *H01Q 3/34* (2006.01)

(52) U.S. Cl.
  CPC    *H01P 1/18* (2013.01); *H01Q 3/34* (2013.01)

(58) Field of Classification Search
  CPC . H01P 1/18; H01P 1/127; H01P 1/184; H01Q 3/34; H01Q 3/36; H01Q 1/50; H01Q 23/00; H03H 7/185
  See application file for complete search history.

(56) References Cited

U.S. PATENT DOCUMENTS

| | | | | |
|---|---|---|---|---|
| 11,428,974 | B2* | 8/2022 | Shishido | G06F 3/0446 |
| 2010/0289717 | A1* | 11/2010 | Arslan | H01Q 23/00 |
| | | | | 343/876 |
| 2015/0097640 | A1* | 4/2015 | Yen | H01L 21/76877 |
| | | | | 257/664 |

FOREIGN PATENT DOCUMENTS

| | | |
|---|---|---|
| CN | 1601685 A | 3/2005 |
| CN | 101743665 A | 6/2010 |
| CN | 102820499 A | 12/2012 |
| CN | 108174620 * | 8/2020 |
| JP | H09178713 * | 7/1997 |

OTHER PUBLICATIONS

China Patent Office, First Office Action dated Dec. 1, 2022 for application No. CN202011192784.4.

* cited by examiner

*Primary Examiner* — Awat M Salih
(74) *Attorney, Agent, or Firm* — Houtteman Law LLC

(57) ABSTRACT

There is provided a phase shifter including a substrate, a signal line on the substrate, ground lines disposed in pairs on the substrate, and at least one film bridge. Two ground lines of the ground lines are on two sides of the signal line and are respectively spaced apart from the signal line. Each film bridge includes a plurality of connection walls and a bridge floor structure that is opposite to the substrate. The connection walls are respectively on the two ground lines. The bridge floor structure includes a phase shifting electrode and at least one pair of adsorption electrodes respectively connected to two sides of the phase shifting electrode. The phase shifting electrode is opposite to the signal line. Two adsorption electrodes in each pair are respectively opposite to the two ground lines, and are respectively connected to the connection walls on the two ground lines.

20 Claims, 9 Drawing Sheets

US 11,677,126 B2

PHASE SHIFTER AND ANTENNA DEVICE

CROSS REFERENCE TO RELATED APPLICATIONS

The present application claims priority to Chinese patent application No. 202011192784.4, filed on Oct. 30, 2020, the content of which is incorporated herein by reference in its entirety.

TECHNICAL FIELD

The present disclosure relates to the field of electronic technology, and in particular, to a phase shifter and an antenna device.

BACKGROUND

A phase shifter is a device capable of adjusting a phase of a wave. The phase shifter is widely applied to the fields of radar, missile attitude control, accelerators, communication, instruments, and even music. Conventional phase shifters include a ferrite phase shifter and a semiconductor phase shifter, which are mainly implemented by using a ferrite material, and switches such as positive-intrinsic-negative (PIN) diodes or field effect transistors. The ferrite phase shifter has a large power capacity and a small insertion loss, but the disadvantages of complex process, expensive manufacturing cost, large volume and the like limit the large-scale application of the ferrite phase shifter. The semiconductor phase shifter has a small volume and a high operating speed, but has disadvantages of small power capacity, high power consumption and high difficulty in manufacturing. Compared with the conventional phase shifters, a micro-electro-mechanical system (MEMS) phase shifter has the advantages of smaller volume, lighter weight, shorter control time, smaller insertion loss, larger loadable power and the like, and has bright prospects of great development and wide application.

SUMMARY

A first aspect of the present disclosure provides a phase shifter, which includes: a substrate, a signal line on the substrate, ground lines in pairs on the substrate, and at least one film bridge, wherein, two ground lines of the ground lines are on two sides of the signal line and are spaced apart from the signal line, respectively, each film bridge includes a plurality of connection walls and a bridge floor structure that is opposite to the substrate, the plurality of connection walls are on the two ground lines, respectively, the bridge floor structure includes a phase shifting electrode and at least one pair of adsorption electrodes respectively connected to two sides of the phase shifting electrode, the phase shifting electrode is opposite to the signal line, two adsorption electrodes in each pair of adsorption electrodes are opposite to the two ground lines, respectively, and are respectively connected to the plurality of connection walls on the two ground lines.

In some embodiments, the plurality of connection walls include two connection walls, the bridge floor structure further includes a plurality of first connection bars, and each of the adsorption electrodes is connected to a corresponding connection wall through the plurality of first connection bars.

In some embodiments, an edge of each of the adsorption electrodes proximal to the phase shifting electrode is aligned with an edge of a corresponding ground line proximal to the signal line in a direction perpendicular to the substrate, a lengthwise direction of each of the two connection walls is parallel to an extension direction of the corresponding ground line, and a dimension of each of the adsorption electrodes in a direction perpendicular to the extension direction of the corresponding ground line is greater than $\frac{1}{3}$ of a width of the corresponding ground line and less than $\frac{2}{3}$ of the width of the corresponding ground line.

In some embodiments, each of the adsorption electrodes is connected to the corresponding connection wall through two first connection bars, each of the first connection bars extends in the direction perpendicular to the extension direction of the corresponding ground line, and a length of each of the first connection bars is 3 to 5 times a thickness of the corresponding connection wall.

In some embodiments, the plurality of first connection bars have a same width.

In some embodiments, a dimension of each of the connection walls in the extension direction of the corresponding ground line is 5 to 10 times the width of each of the first connection bars.

In some embodiments, each film bridge has an axisymmetric structure, and a symmetry axis of each film bridge is perpendicular to an extension direction of each of the ground lines.

In some embodiments, each of the adsorption electrodes is connected to the corresponding connection wall through three first connection bars.

In some embodiments, a lengthwise direction of each of the two connection walls is parallel to an extension direction of a corresponding ground line, at least one accommodation notch is in an edge of each of the adsorption electrodes proximal to the corresponding connection wall, one end of each of the first connection bars is connected to the corresponding connection wall, and the other end thereof extends into the at least one accommodation notch and is connected to the adsorption electrode.

In some embodiments, each of the first connection bars includes a first bar-shaped portion, a second bar-shaped portion, and a third bar-shaped portion which extend in a direction perpendicular to an extension direction of a corresponding ground line and are sequentially arranged to be spaced apart from each other in the extension direction of the corresponding ground line, a first end of the first bar-shaped portion is connected to the corresponding connection wall, a second end of the first bar-shaped portion is connected to a first end of the second bar-shaped portion, a second end of the second bar-shaped portion is connected to a first end of the third bar-shaped portion, and a second end of the third bar-shaped portion is connected to the adsorption electrode.

In some embodiments, each adsorption electrode is connected to the corresponding connection wall through two first connection bars, and two third bar-shaped portions of the two first connection bars are both outside two first bar-shaped portions of the two first connection bars.

In some embodiments, each adsorption electrode is connected to the corresponding connection wall through two first connection bars, and two third bar-shaped portions of the two first connection bars are both between two first bar-shaped portions of the two first connection bars.

In some embodiments, each of the first connection bars includes a first connection portion, a first U-shaped portion, a second U-shaped portion, and a second connection portion, ends of which are connected to each other in sequence, the first connection portion and the second connection portion extend in a direction perpendicular to the extension direction of the corresponding ground line, an opening of the first U-shaped portion and an opening of the second U-shaped portion are directed towards the extension direction of the corresponding ground line, and the openings of the first U-shaped portion and the second U-shaped portion are directed towards opposite directions, respectively.

In some embodiments, each adsorption electrode is connected to the corresponding connection wall through two first connection bars, each adsorption electrode has two accommodation notches in an edge of the adsorption electrode proximal to the corresponding connection wall, and the two accommodation notches are in one-to-one correspondence with the two first connection bars, and one end of each first connection bar is connected to the corresponding connection wall, and the other end of each first connection bar extends into a corresponding accommodation notch and is connected to the adsorption electrode.

In some embodiments, a lengthwise direction of each of the two connection walls is parallel to an extension direction of a corresponding ground line, each of the ground lines includes a ground-line main body and at least one ground electrode on a side of the ground-line main body proximal to the signal line, the at least one ground electrode is electrically connected to the ground-line main body, an edge of each adsorption electrode proximal to the phase shifting electrode extends beyond the ground-line main body, and the adsorption electrode is opposite to the at least one ground electrode.

In some embodiments, an edge of each ground electrode is aligned with an edge of a corresponding adsorption electrode in a direction perpendicular to the substrate.

In some embodiments, the plurality of connection walls include four connection walls, each of the adsorption electrodes is on a corresponding ground line through two of the four connection walls, a lengthwise direction of each of the connection walls is perpendicular to an extension direction of the corresponding ground line, and each of two sides, which are perpendicular to the extension direction of the corresponding ground line, of each adsorption electrode is connected to one of the connection walls through a plurality of first connection bars.

In some embodiments, the phase shifting electrode overlaps at least a part of the signal line in a direction perpendicular to the substrate.

A second aspect of the present disclosure provides an antenna device, which includes a plurality of antenna units and a radio frequency signal supply circuit, wherein, each of the plurality of antenna units includes a radio frequency antenna and at least one phase shifter connected with the radio frequency antenna, the radio frequency signal supply circuit is configured to supply a radio frequency signal to the radio frequency antenna through the at least one phase shifter, and each of the at least one phase shifter is the phase shifter according to any one of the foregoing embodiments of the first aspect of the present disclosure; and each of the plurality of antenna units further includes a bias voltage supply circuit configured to supply a bias voltage to the film bridge of each of the at least one phase shifter.

In some embodiments, the antenna device further includes a plurality of main switch units in one-to-one correspondence with and respectively connected to the plurality of antenna units, wherein, each of the plurality of antenna unit further includes at least one sub-switch unit in one-to-one correspondence with the at least one phase shifter, each phase shifter is connected to a corresponding main switch unit through a corresponding sub-switch unit, the bias voltage supply circuit is configured to send a control signal to the at least one sub-switch unit through the corresponding main switch unit to cause the at least one sub-switch unit to be selectively turned on, and each phase shifter is configured to provide the radio frequency signal to a corresponding radio frequency antenna when the corresponding sub-switch unit is turned on.

BRIEF DESCRIPTION OF THE DRAWINGS

The accompanying drawings, which are provided for further understanding of the present disclosure and constitute a part of this specification, are for explaining the present disclosure together with the following exemplary embodiments, but are not intended to limit the present disclosure. In the drawings.

DETAILED DESCRIPTION

Exemplary embodiments of the present disclosure will be described in detail below with reference to the accompanying drawings. It should be understood that the exemplary embodiments described herein are only for illustrating and explaining the present disclosure, but are not intended to limit the present disclosure.

The inventors of the present inventive concept have found that, in an existing MEMS phase shifter, a middle portion of a metal film bridge is suspended above a coplanar waveguide signal line with an air gap between the signal line and the metal film bridge. Each metal film bridge and the signal line form a switch, and electrostatic adsorption can occur between the middle portion of the metal film bridge and the signal line by providing a bias voltage Vs to the metal film bridge, such that the metal film bridge is pulled down to a certain position above a dielectric isolation layer on the signal line, and a capacitance between the metal film bridge and the signal line is changed, thereby changing a phase of a radio frequency signal transmitted on the signal line.

However, in the existing MEMS phase shifter, the switch formed by each metal film bridge and the signal line can only be switched between a turn-on state and a turn-off state, i.e., the capacitance between the metal film bridge and the signal line can only be switched between two values. Therefore, an adjustment amount of each switch for adjusting a phase of a radio frequency signal is a fixed value, and a phase adjustment capability of a single switch is limited. Thus, the phase of the radio frequency signal transmitted on the signal line can only be adjusted by changing the number of the switches, which are turned on, of a plurality of series-connected switches.

Further, the inventors of the present inventive concept have found in their researches that, the reason why the conventional MEMS phase shifter can only be switches between the turn-on state and the turn-off state and a single switch formed by each metal film bridge and the signal line cannot continuously adjust the phase is that a linearity between the bias voltage Vs and a pull-down amount of a bridge floor of the phase shifter (or the capacitance between the bridge floor and the signal line) is poor. In the conventional MEMS phase shifter, the film bridge is driven to be pulled down by electrostatic adsorption between the signal line and the film bridge, and generally cannot be further pulled down after the film bridge is pulled down by one third of a distance between the film bridge and the signal line. However, a sub-range of bias voltages that allows the phase shifter to have the maximum phase shift lies in the last 5% of a range of the bias voltages. Thus, it is difficult to achieve stable and continuous control on an amount of pull-down displacement. Therefore, it is a technical problem to be solved urgently in the art to provide a phase shifter with a higher phase adjustment capability.

Figure 1:
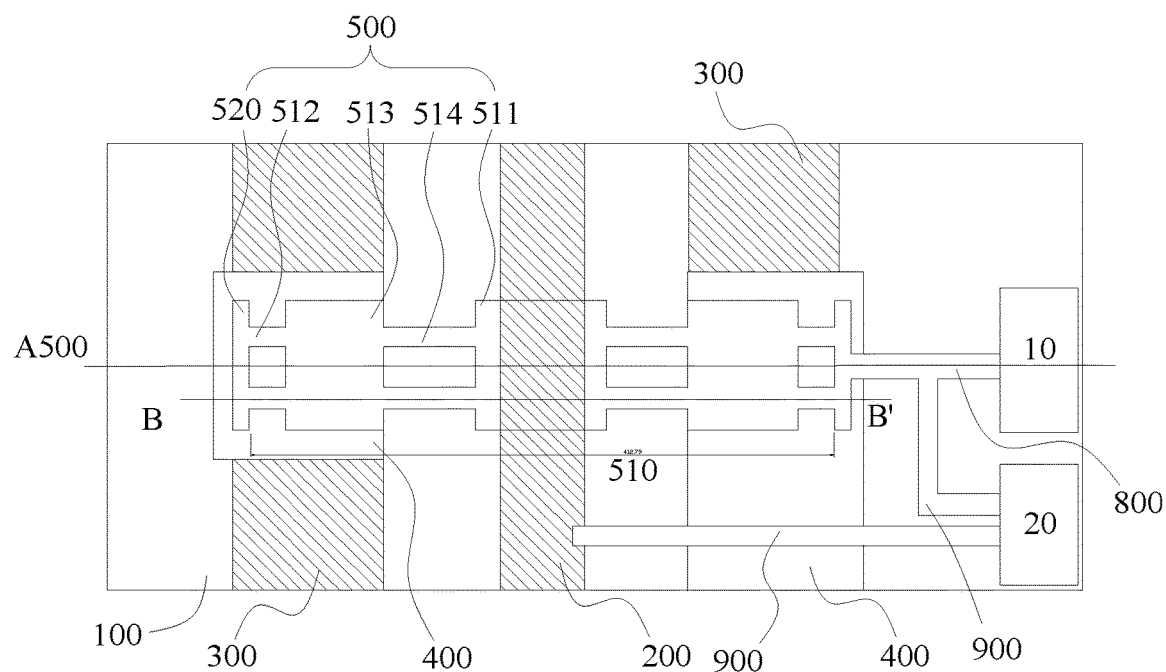
FIG. 1 is a schematic diagram (e.g., a top view) showing a structure of a phase shifter according to an embodiment of the present disclosure.

At least in order to solve the above technical problems, as an aspect of the present disclosure, there is provided a phase shifter as shown in FIGS. 1-2, 4-9, and 12A-13. The phase shifter may include a substrate 100, a signal line 200 disposed on the substrate 100, ground lines 300 disposed in pairs on the substrate 100, and at least one film bridge 500. For example, two ground lines 300 in a same pair of ground lines 300 are located at both sides of the signal line 200 and spaced apart from the signal line 200, respectively. The film bridge 500 includes a plurality of connection walls (which may also be referred to as anchor points) 520 and a bridge floor structure (which may also be referred to as a bridge deck structure) 510 disposed opposite to the substrate 100 and supported by the plurality of connection walls 520. The plurality of connection walls 520 are respectively disposed on the two ground lines 300, and the bridge floor structure 510 includes a phase shifting electrode 511 and at least one pair of adsorption electrodes 513 connected to both sides of the phase shifting electrode 511. The phase shifting electrode 511 is disposed opposite to the signal line 200 (e.g., the phase shifting electrode 511 overlaps at least a part of the signal line 200 in a direction perpendicular to the substrate 100 (e.g., in a vertical direction in FIG. 2), as shown in FIG. 1). The two adsorption electrodes 513 in the same pair of adsorption electrodes 513 are disposed opposite to the two ground lines 300, respectively (e.g., in the direction perpendicular to the substrate 100, the two adsorption electrodes 513 in the same pair of adsorption electrodes 513 overlap at least parts of the two ground lines 300, respectively, as shown in FIG. 1), and are connected to the connection walls 520 on the corresponding ground lines 300, respectively. For example, the signal line 200 and each ground line 300 may contact the substrate 100, and be located in a same plane to form a coplanar waveguide. For example, the film bridge 500 and the signal line 200 may have a cavity (or an air gap) therebetween.

A material of the film bridge 500 is not particularly limited in an embodiment of the present disclosure, and for example, the material of the film bridge 500 may optionally include a material of metal. The bridge floor structure 510 and the plurality of connection walls 520 of the film bridge 500 may have a one-piece structure.

Figure 3:
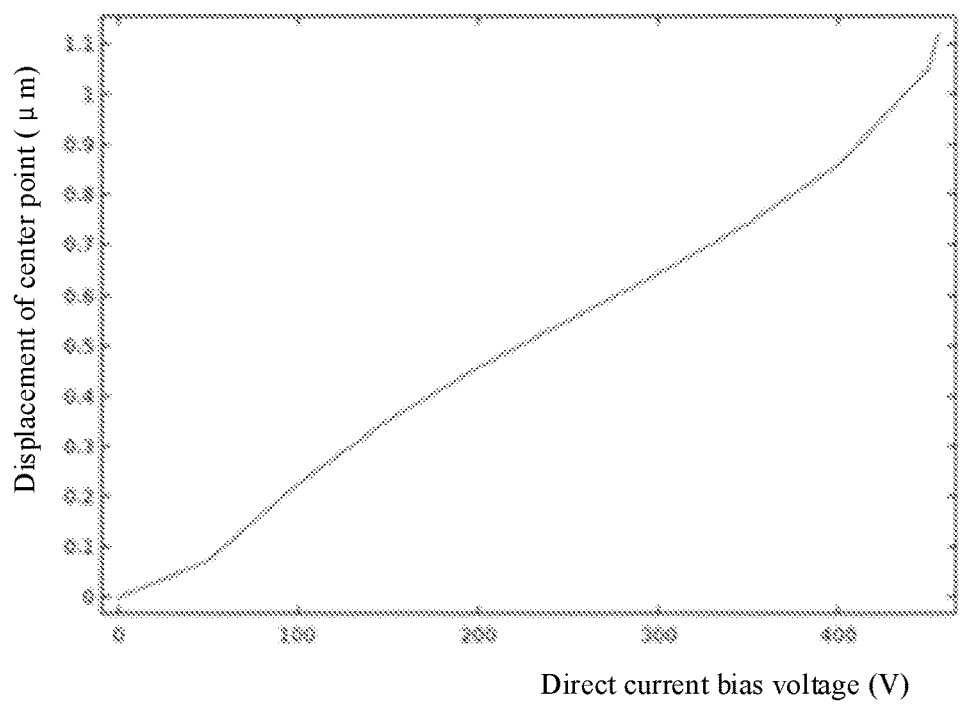
FIG. 3 is a schematic diagram illustrating that a displacement of a center point of a film bridge of a phase shifter according to an embodiment of the present disclosure is changed as a bias voltage is changed.

FIG. 3 is a schematic diagram showing that a displacement of a center point of the film bridge of the phase shifter according to an embodiment of the present disclosure is changed as a bias voltage applied to the film bridge, and this diagram is plotted according to a test result with 9 bias voltage sampling points of 0 V, 50 V, 100 V, 150 V, 200 V, 250 V, 300 V, 350 V, and 400 V. As can be seen from FIG. 3, the phase shifter according to an embodiment of the present disclosure drives the film bridge 500 to be pulled down by using an electric field that is formed between each of the adsorption electrodes 513 and the corresponding ground line 300 and is at an end of the film bridge 500, thereby changing a distance between the bridge floor structure 510 and the signal line 200. The displacement of the film bridge 500 being pulled down (i.e., a capacitance between the bridge floor structure 510 and the signal line 200) and a magnitude of the bias voltage have a good linear relationship (i.e., a good linearity) therebetween, such that the displacement of the film bridge being pulled down can be accurately controlled, and continuous phase adjustment can be realized.

In the phase shifter according to an embodiment of the present disclosure, both sides of the phase shifting electrode 511 of the bridge floor structure 510 are connected with the adsorption electrodes 513 arranged in pairs, and the two adsorption electrodes 513 correspond to positions of the two ground lines 300, respectively. Thus, after a bias voltage signal (which may be referred to as a bias voltage for short) is provided to the film bridge 500, the two adsorption electrodes 513 on the two sides of the phase shifting electrode 511 are adsorbed by the corresponding ground lines 300, respectively, and the film bridge 500 is driven to be pulled down by the electric field that is between each adsorption electrode 513 and the corresponding ground line 300 and is located at a corresponding end of the film bridge 500, thereby changing the distance between the bridge floor structure 510 and the signal line 200. In the process of the pull-down, a deformation of the film bridge 500 mainly occurs at the adsorption electrodes 513 at edges of the bridge floor, and the displacement of the center point of the bridge floor and the bias voltage have a good linear relationship therebetween, such that the displacement of the pull-down of the bridge floor of the film bridge 500 can be accurately controlled by changing the magnitude of the bias voltage, and continuous phase adjustment can be realized by a single phase shifter. Compared with the scheme that a switch unit of the traditional MEMS phase shifter can only be switched between the turn-on state and the turn-off state (i.e., the phase of the radio frequency signal can only be adjusted by a fixed amplitude), the present embodiment greatly improves a phase shifting capability of the phase shifter.

Figure 2:
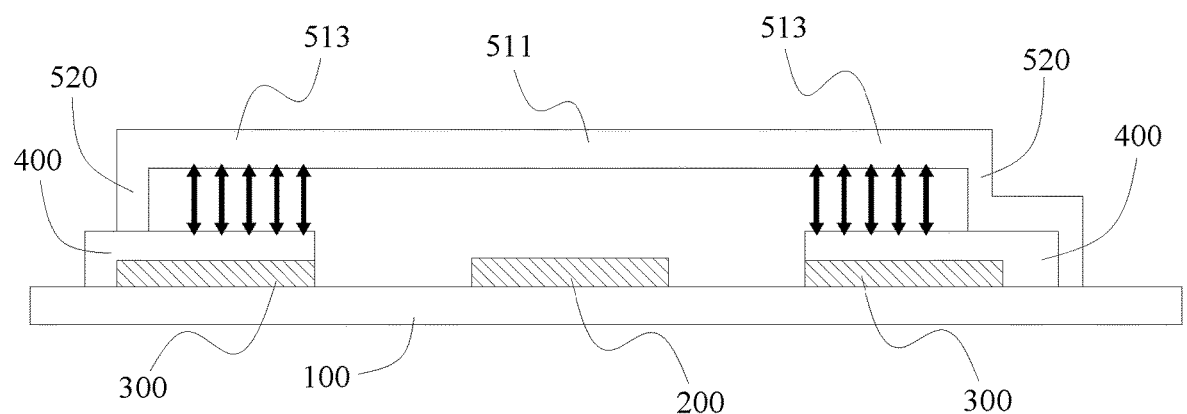
FIG. 2 is a schematic view illustrating a principle that a film bridge of the phase shifter shown in FIG. 1 is pulled down, and is a schematic cross-sectional view of the phase shifter shown in FIG. 1 taken along a line B-B'.

In order to improve the safety of the phase shifter and prevent the film bridge 500 and the ground line 300 from contacting each other to cause electric leakage, in an embodiment, an insulating isolation layer 400 is disposed between each ground line 300 and the corresponding connection wall 520, as shown in FIGS. 1-2.

In order to reduce a driving voltage of the phase shifter and increase a sensitivity of the phase shifter, in an embodiment, the film bridge 500 includes two connection walls 520, and the bridge floor structure 510 further includes a plurality of first connection bars 512; further, each of the two adsorption electrodes 513 in the same pair is connected to the corresponding connection wall 520 through the plurality of first connection bars 512, as shown in FIGS. 1-2 and 4-9.

In the present embodiment, each of the adsorption electrodes 513 is connected to the corresponding connection wall 520 through the plurality of first connection bars 512, such that a Young's modulus of a connection portion between each of the adsorption electrodes 513 and the corresponding connection wall 520 can be reduced, and the film bridge 500 can be pulled down by an electrostatic field generated by a lower bias voltage, thereby improving the sensitivity of the phase shifter.

In order to reduce an amount of material used for the bridge floor structure 510 and reduce a manufacturing cost of the phase shifter, in an embodiment, the bridge floor structure 510 further includes a plurality of second connection bars 514, and each of the two adsorption electrodes 513 is connected to the phase shifting electrode 511 through the plurality of second connection bars 514, as shown in FIGS. 1-2, 4-9, and 12A-13.

Figure 6:
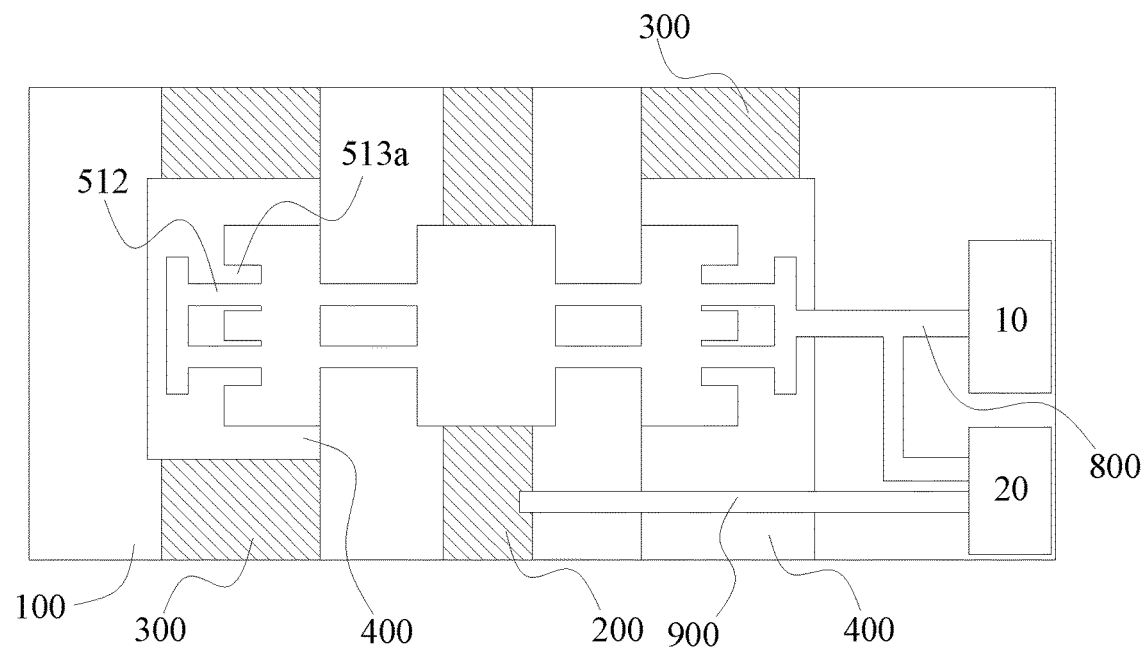
FIG. 6 is a schematic diagram (e.g., a top view) showing a structure of a phase shifter according to another embodiment of the present disclosure.
Figure 7:
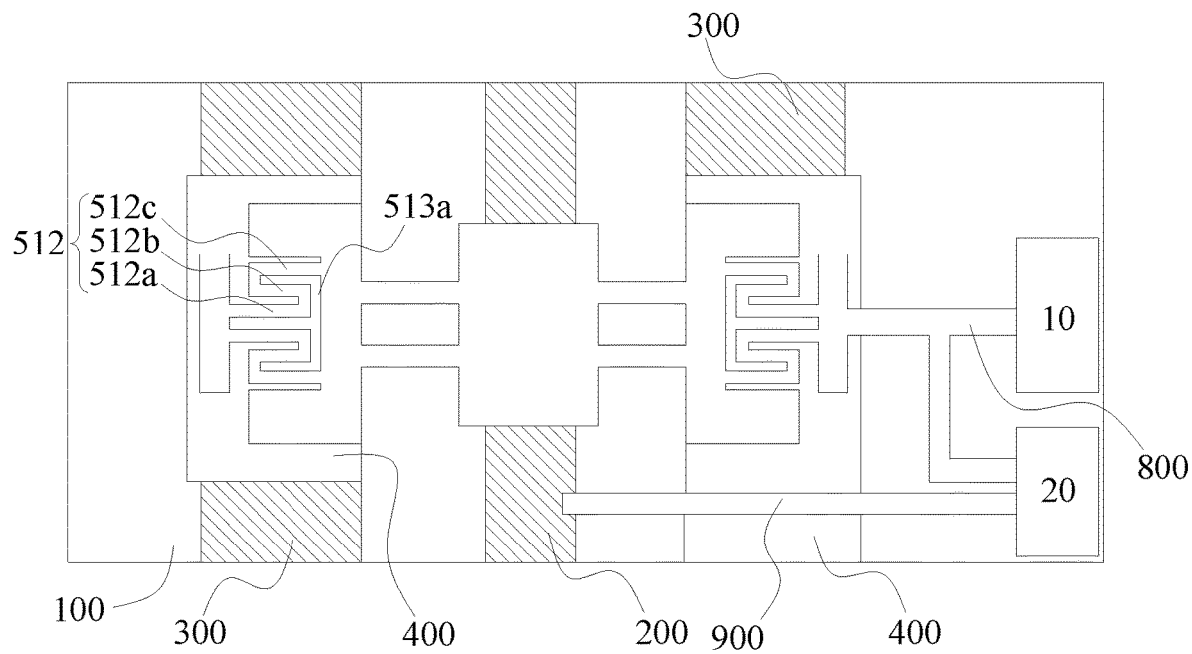
FIG. 7 is a schematic diagram (e.g., a top view) showing a structure of a phase shifter according to another embodiment of the present disclosure.
Figure 8:
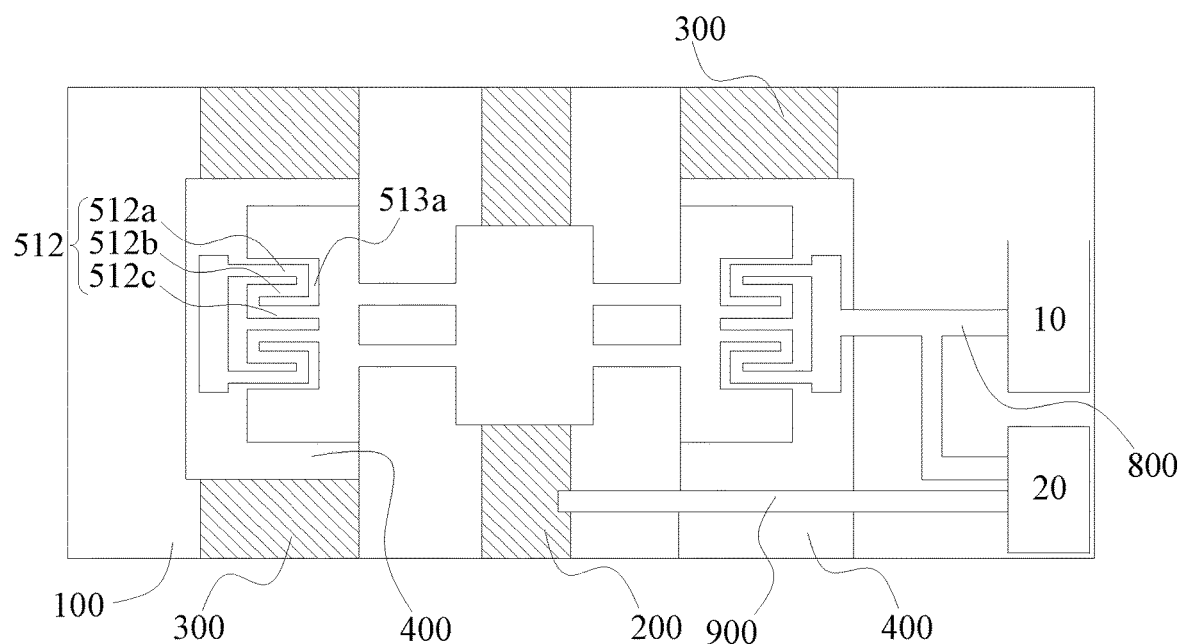
FIG. 8 is a schematic diagram (e.g., a top view) showing a structure of a phase shifter according to another embodiment of the present disclosure.

The number of the second connection bars 514 connected between the phase shifting electrode 511 and each of the connection walls 520 and the number of the first connection bars 512 connected between each of the adsorption electrodes 513 and the corresponding connection wall 520 are not particularly limited in an embodiment of the present disclosure. For example, as an exemplary embodiment of the present disclosure, each of the two adsorption electrodes 513 is connected to the corresponding connection wall 520 through two first connection bars 512, and is connected to the phase shifting electrode 511 through two second connection bars 514, as shown in FIGS. 6-8. As such, the stability of the bridge floor is improved to prevent the bridge floor from turning over, while the amount of material used for the bridge floor structure 510 is reduced to reduce the manufacturing cost of the phase shifter.

In order to reduce the bias voltage required to drive the film bridge 500 to be pulled down while ensuring the magnitude of an electrostatic driving force, in an embodiment, an edge of each adsorption electrode 513 proximal to the phase shifting electrode 511 is aligned (or flush) with an edge of the corresponding ground line 300 proximal to the signal line 200 in the direction perpendicular to the substrate 100 (e.g., as illustrated in FIG. 1). When viewed along the direction perpendicular to the substrate 100, a lengthwise direction of each of the connection walls 520 is parallel to an extension direction (i.e., lengthwise direction, and for example, a vertical direction in FIG. 1) of the corresponding ground line 300, and a dimension (or size) of each of the adsorption electrodes 513 in a direction (e.g., a horizontal direction in FIG. 1) perpendicular to the extension direction of the corresponding ground line 300 is greater than ⅓ of a width of the corresponding ground line 300 and less than ⅔ of the width of the corresponding ground line 300.

Figure 4:
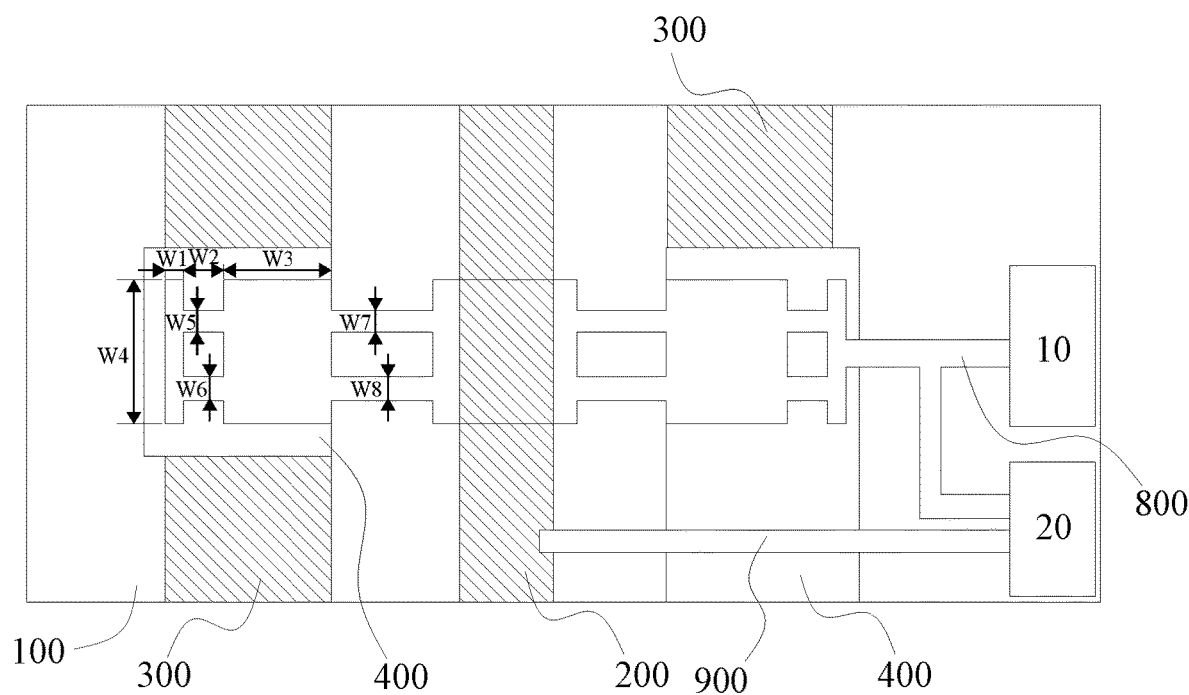
FIG. 4 is a schematic diagram (e.g., a top view) showing a structure of a phase shifter according to another embodiment of the present disclosure.

Specifically, as shown in FIG. 4, W1 is a thickness of each of the connection walls 520 (or is a width of each anchor point), W4 is a dimension (e.g., a length) of each of the connection walls 520 (or W4 is a span length of each anchor point) in the extension direction of the corresponding ground line 300, W3 is a dimension (e.g., a width) of each of the adsorption electrodes 513 in the direction perpendicular to the extension direction of the corresponding ground line 300, W2 is a length of each of the first connection bars 512, W5 and W6 are widths of the two first connection bars 512 shown in FIG. 4, respectively, and W7 and W8 are widths of the two second connection bars 514 shown in FIG. 4, respectively. In an embodiment of the present disclosure, the width W3 of each adsorption electrode 513 is greater than one third (i.e., ⅓) of the width of the corresponding ground line 300, thereby ensuring that there is a sufficiently large rightly opposite area between each adsorption electrode 513 and the corresponding ground line 300 (i.e., a sufficiently large overlapping area of each adsorption electrode 513 and the corresponding ground line 300 in the direction perpendicular to the substrate 100) to ensure that the magnitude of the electrostatic driving force is small. Further, the width of each adsorption electrode 513 does not exceed two-thirds (i.e., ⅔) of the width of the corresponding ground line 300, such that it is possible to prevent a distance between each connection wall 520 and the corresponding adsorption electrode 513 (i.e., the length W2 of each of the first connection bars 512) from being too small to cause the entire film bridge 500 not to be pulled down at a small driving voltage.

Further, in an embodiment, the width W3 of each adsorption electrode 513 is not more than (e.g., less than) one-half (i.e., ½) of the width of the corresponding ground line 300, i.e., 2W3>W1+W2>W3, where W1+W2+W3 is equal to the width of the corresponding ground line 300, as shown in FIG. 4.

In order to ensure that the Young's modulus of the connection portion between each of the adsorption electrodes 513 and the corresponding connection wall 520 is reduced, in an embodiment, in a case where each of the adsorption electrodes 513 is connected to the corresponding connection wall 520 through two first connection bars 512, and each of the first connection bars 512 extends in the direction perpendicular to the extension direction of the corresponding ground line 300, the length W2 of each of the first connection bars 512 is exemplarily 3 to 5 times the thickness W1 of the corresponding connection wall 520, i.e., W2/W1=3 to 5.

To improve a phase shifting accuracy of the phase shifter, in an embodiment, the first connection bars 512 have a same width (e.g., W5=W6), such that stresses on both sides of the film bridge 500 are equal to each other when the film bridge 500 is bent, thereby ensuring that the film bridge 500 moves vertically when the phase shifter is operated. Thus, the film bridge 500 is prevented from being inclined or twisted, thereby ensuring that the phase shifting accuracy of the phase shifter is high. Further, in an embodiment, as shown in FIGS. 1-2, 4-9, and 12A-13, the film bridge 500 is an axisymmetric structure, and a symmetry axis A500 (shown in FIG. 1) of the film bridge 500 is perpendicular to the extension direction (e.g., the vertical direction in FIG. 1) of each ground line 300. For example, W5=W6=W7=W8, and the ratio of W4/W5 is between 5 and 10, which may reduce the Young's modulus of the film bridge 500 and improve the stability of the film bridge 500.

To improve the structural stability of the film bridge 500, in an embodiment, the dimension (e.g., length) W4 of each of the connection walls 520 along the extension direction of the corresponding ground line 300 is 5 to 10 times of the width (e.g., W5 or W6) of each of the first connection bars 512, such that the width of each of the first connection bars 512 is ensured to be small to reduce the Young's modulus of each of the first connection bars 512 to the maximum extent, and thus, reduce the driving voltage, and the width of each of the first connection bars 512 is ensured not to be too small to prevent the film bridge 500 from collapsing due to deformation under stress, thereby ensuring the structural stability of the film bridge 500.

Figure 5:
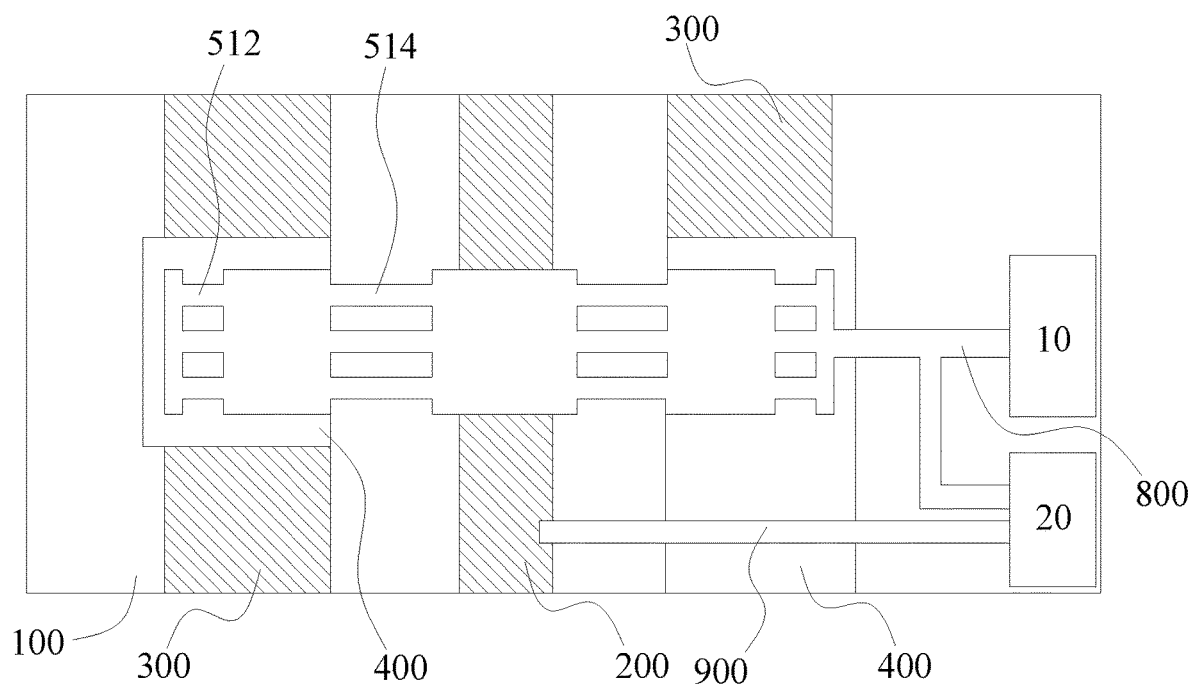
FIG. 5 is a schematic diagram (e.g., a top view) showing a structure of a phase shifter according to another embodiment of the present disclosure.

To further improve the supporting performance of the film bridge 500 and reduce the collapse rate of the film bridge 500, in an embodiment, each of the two adsorption electrodes 513 in the same pair is connected to the corresponding connection wall 520 through three first connection bars 512, as shown in FIG. 5.

In order to further reduce the Young's modulus of the portion of the film bridge 500 at the first connection bars 512 while ensuring a sufficiently large rightly opposite area between each adsorption electrode 513 and the corresponding ground line 300, in an embodiment as shown in FIG. 6, when viewed from the direction perpendicular to the substrate 100, the lengthwise direction of each connection wall 520 is parallel to the extension direction of the corresponding ground line 300, and each adsorption electrode 513 is provided with at least one accommodation notch (or receiving groove) 513a on its side proximal to the corresponding connection wall 520. One end of each first connection bar 512 is connected to the corresponding connection wall 520, and the other end thereof extends into the accommodation notch 513a and is connected to the adsorption electrode 513. For example, as shown in FIG. 6, two accommodation notches 513a are formed on the side of each adsorption electrode 513 proximal to the corresponding connection wall 520, and two first connection bars 512 are in one-to-one correspondence with the two accommodation notches 513a. One end of each first connection bar 512 is connected to the corresponding connection wall 520, and the other end of each first connection bar extends into the corresponding accommodation notch 513a and is connected to the adsorption electrode 513. As such, the portion of each of the adsorption electrodes 513 located between the two accommodation notches 513a can increase the rightly opposite area between the adsorption electrode and the corresponding ground line 300, thereby facilitating the reduction of the driving voltage.

To further reduce the Young's modulus of the portion of the film bridge 500 at the first connection bars 512, in an embodiment, each of the first connection bars 512 may have a zigzag circuitous structure, as shown in FIGS. 7-8. Each first connection bar 512 includes a first bar-shaped portion 512a, a second bar-shaped portion 512b, and a third bar-shaped portion 512c, which extend along the direction perpendicular to the extension direction of the corresponding ground line 300 and are sequentially arranged to be spaced apart from each other along the extension direction of the corresponding ground line 300. A first end of the first bar-shaped portion 512a is connected to the corresponding connection wall 520, and a second end of the first bar-shaped portion 512a is connected to a first end of the second bar-shaped portion 512b. A second end of the second bar-shaped portion 512b is connected to a first end of the third bar-shaped portion 512c, and a second end of the third bar-shaped portion 512c is connected to (the bottom of the accommodation notch 513a of) the corresponding adsorption electrode 513.

In this embodiment, each of the first connection bars 512 has the zigzag circuitous structure and is disposed in the accommodation notch 513a, such that a width-limited region according to the accommodation notch 513a is used for further lengthening the length of each of the first connection bars 512, thereby further reducing an elastic force generated when the film bridge 500 is subjected to a same-amplitude pull-down operation, and improving the sensitivity of the phase shifter.

When two zigzag circuitous first bar-shaped portions 512a according to the present disclosure are connected to each of the connection walls 520, for an example, the two first bar-shaped portions 512a are disposed symmetrically (e.g., about the symmetry axis A500 shown in FIG. 1). For example, as shown in FIG. 7, two third bar-shaped portions 512c are both located outside the corresponding two first bar-shaped portions 512a. Alternatively, as shown in FIG. 8, the two third bar-shaped portions 512c are both located between the corresponding two first bar-shaped portions 512a, such that the stresses on both sides of the film bridge 500 are kept to be equal to each other when the film bridge 500 is bent. Thus, when the phase shifter is operated, the film bridge 500 is ensured to move vertically, and meanwhile, the film bridge 500 is prevented from inclining or twisting, thereby ensuring that the phase shifting precision of the phase shifter is high.

Figure 9:
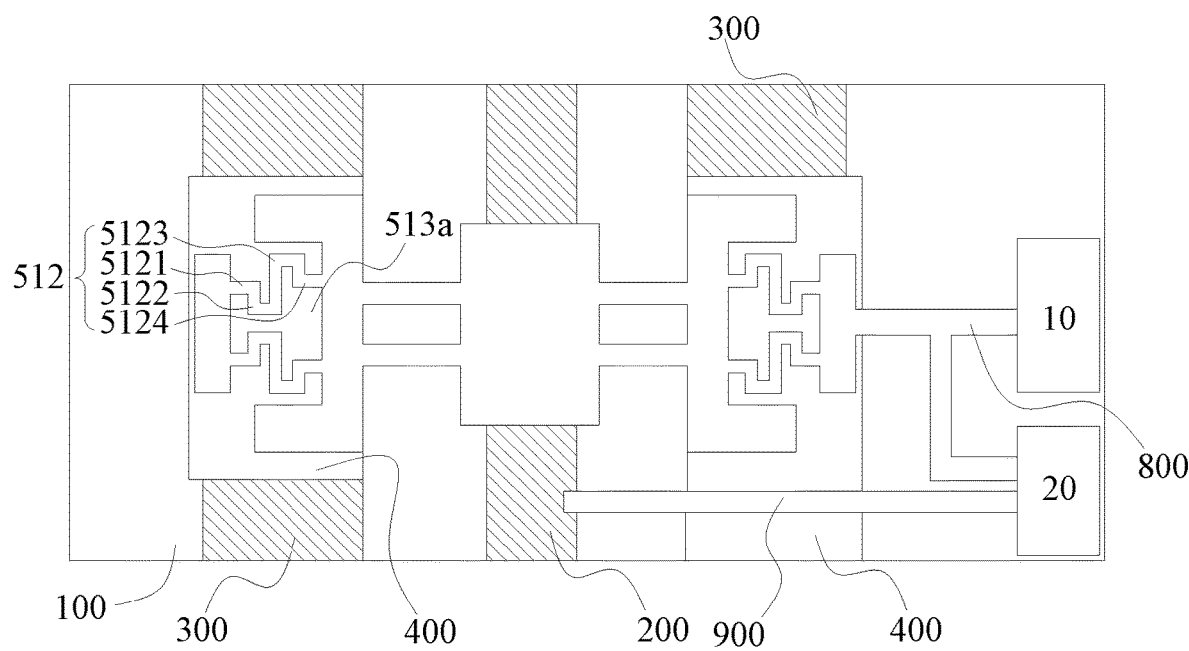
FIG. 9 is a schematic diagram (e.g., a top view) showing a structure of a phase shifter according to another embodiment of the present disclosure.

To further reduce the Young's modulus of the portion of the film bridge 500 at the first connection bars 512, in an embodiment, each of the first connection bars 512 may alternatively have a serpentine structure (e.g., an S-shaped structure), as shown in FIG. 9. Each of the first connection bars 512 includes a first connection portion 5121, a first U-shaped portion 5122, a second U-shaped portion 5123, and a second connection portion 5124, ends of which are sequentially connected to each other. The first connection portion 5121 and the second connection portion 5124 extend in the direction perpendicular to the extension direction of the corresponding ground line 300. An opening of the first U-shaped portion 5122 and an opening of the second U-shaped portion 5123 are all along (or directed towards) the extension direction of the corresponding ground line 300, and the openings of the first U-shaped portion 5122 and the second U-shaped portion 5123 are directed towards opposite directions, respectively.

It should be noted that the term "U-shaped" used in an embodiment of the present disclosure does not limit a U-shaped portion to being exactly identical to the letter U, but refers to a folded shape in which one end of the first U-shaped portion 5122 or the second U-shaped portion 5123 is bent by about 180 degrees with respect to the other end thereof, as shown in FIG. 9.

Figure 12A:
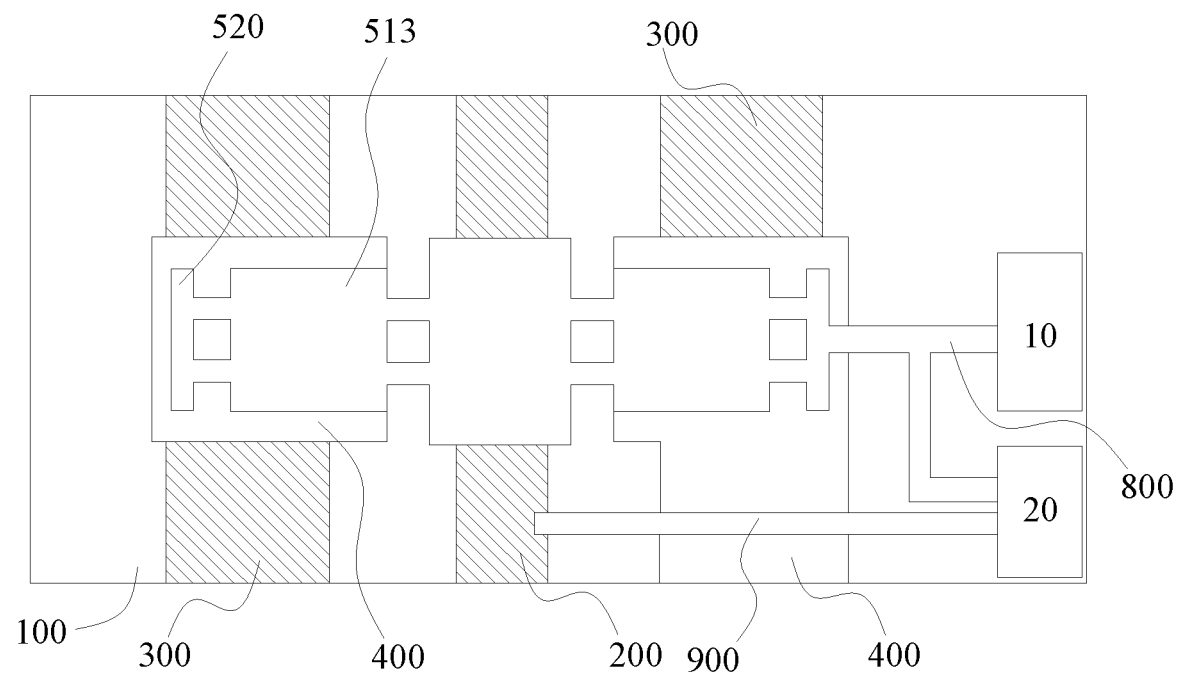
FIG. 12A is a schematic diagram (e.g., a top view) showing a structure of a phase shifter according to another embodiment of the present disclosure.
Figure 12B:
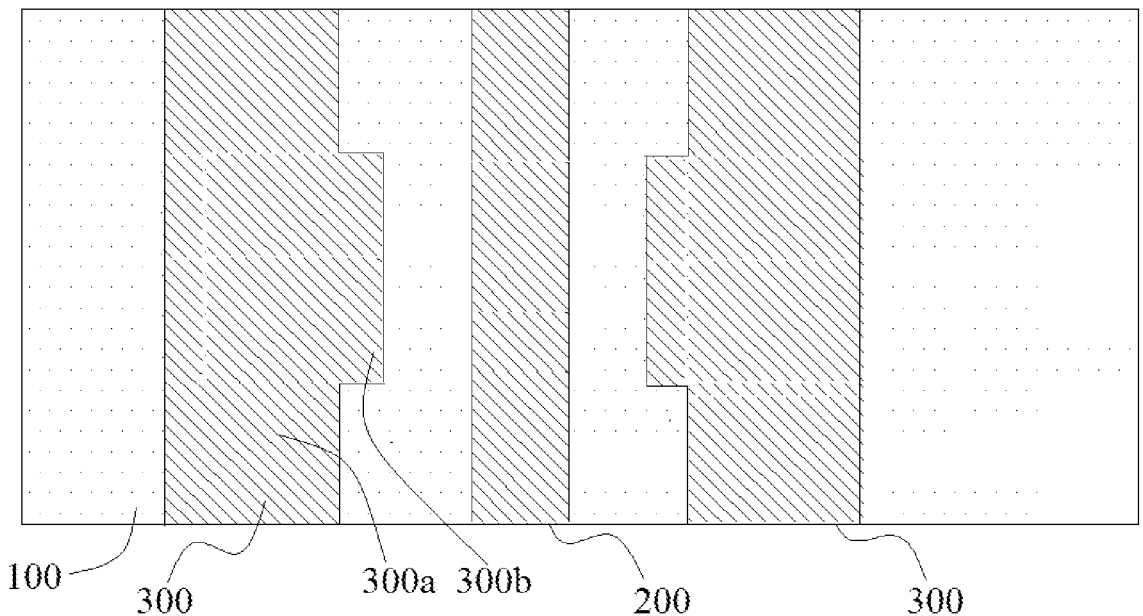
FIG. 12B shows that each ground line of the phase shifter includes a ground-line main body and at least one ground electrode disposed on a side of the ground-line main body proximal to a signal line.

In order to further increase the rightly opposite area between each adsorption electrode 513 and the corresponding ground line 300 while extending each of the first connection bars 512, as another exemplary embodiment of the present disclosure as shown in FIGS. 12A-12B, the lengthwise direction of each connection wall 520 is parallel to the extension direction of the corresponding ground line 300, and each ground line 300 includes a ground-line main body 300a and at least one ground electrode 300b (which is covered by an extended insulating isolation layer 400 in FIG. 12A) disposed at a side of the ground-line main body 300a proximal to the signal line 200, the ground electrode 300b being electrically connected to the ground-line main body 300a. An edge of each of the adsorption electrodes 513 proximal to the phase shifting electrode 511 extends beyond a corresponding ground-line main body 300a, and each of the adsorption electrodes 513 is opposite to a corresponding ground electrode 300b. For example, in the direction perpendicular to the substrate 100, an edge of the ground electrode 300b is aligned with (or flush with) an edge of the corresponding adsorption electrode 513, as shown in FIGS. 12A-12B.

In the present embodiment, each of the adsorption electrodes 513 is moved to a position between the signal line 200 and the ground-line main body 300a of the corresponding ground line 300, and a portion, which corresponds to the corresponding adsorption electrode 513, of each of the ground lines 300 is enlarged to extend towards the signal line 200, thereby further increasing the rightly opposite area between each of the adsorption electrodes 513 and the corresponding ground line 300 while extending each of the first connection bars 512. As a result, the performance of the phase shifter is improved.

Figure 13:
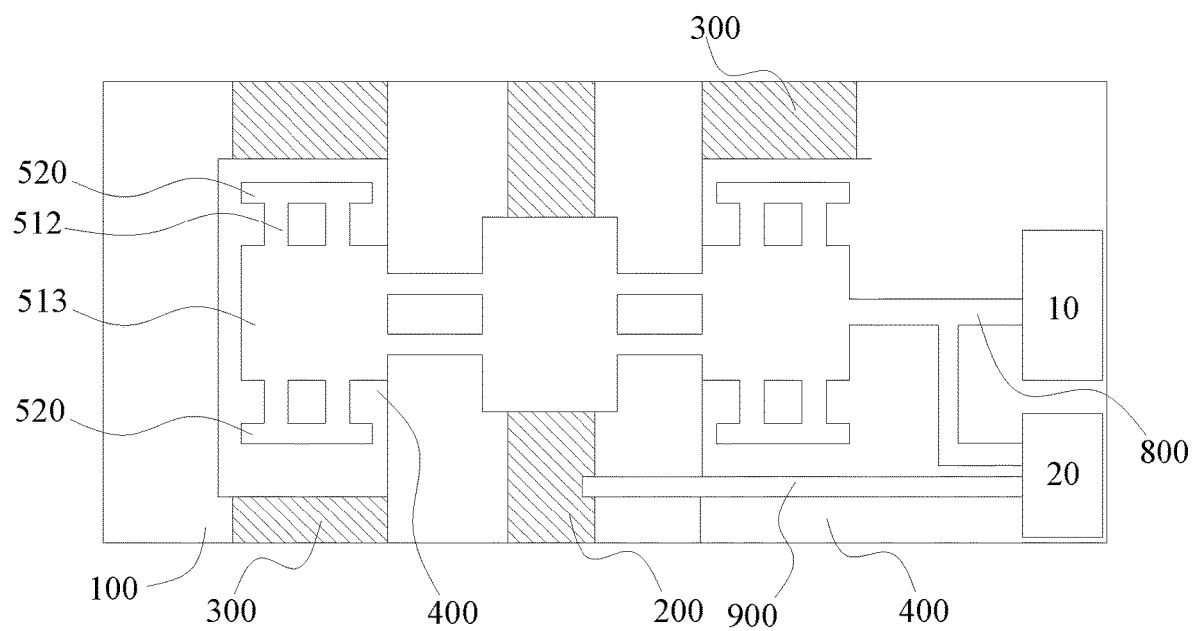
FIG. 13 is a schematic diagram (e.g., a top view) showing a structure of a phase shifter according to another embodiment of the present disclosure.
Figure 14A:
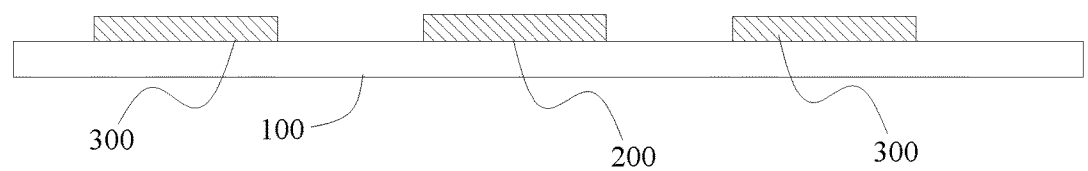
FIGS. 14($a$) to 14($e$) are schematic diagrams (e.g., cross-sectional views) showing structures of a phase shifter in various steps of a method for manufacturing the phase shifter, according to an embodiment of the present disclosure.
Figure 14B:
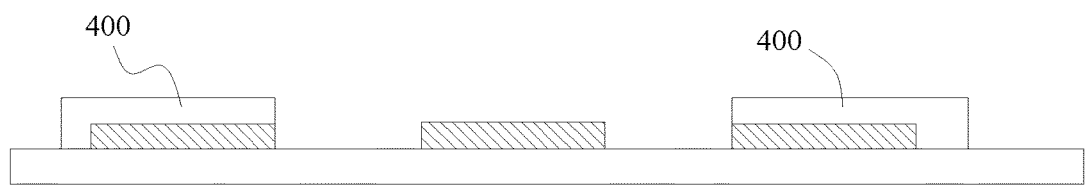
Figure 14C:
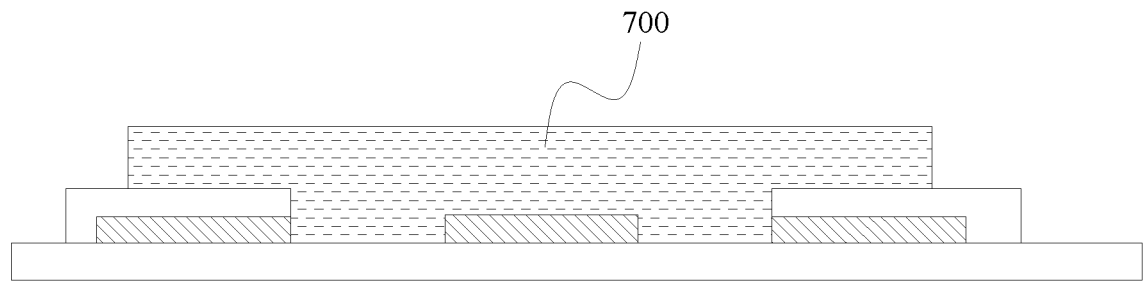
Figure 14D:
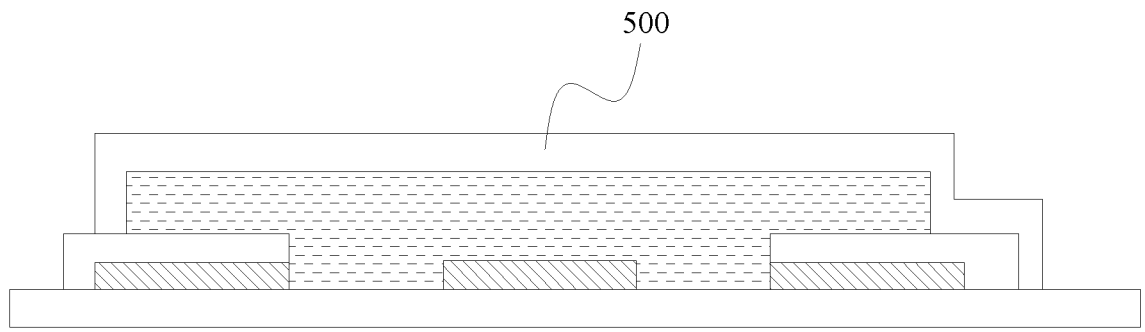
Figure 14E:
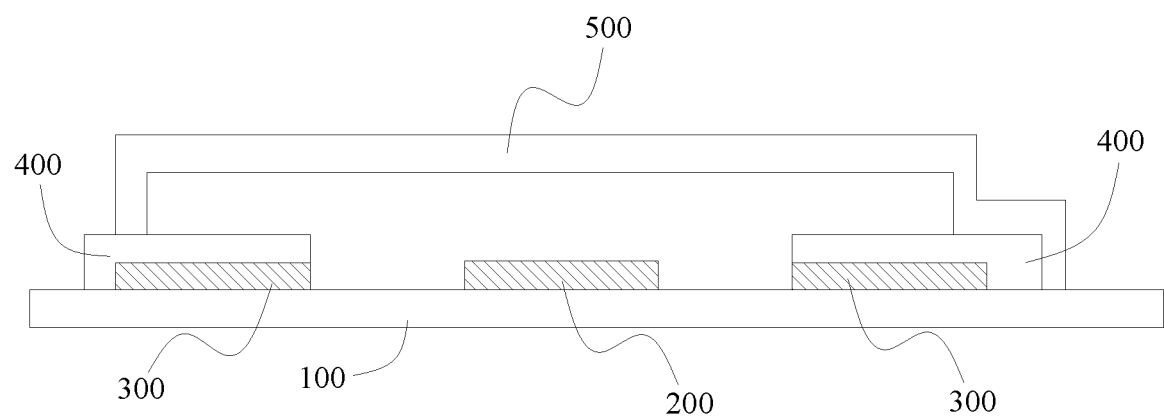

As another exemplary embodiment of the present disclosure, as shown in FIG. 13, each of the adsorption electrodes 513 is disposed on the corresponding ground line 300 through two connection walls 520, and the lengthwise direction of each of the connection walls 520 is perpendicular to the extension direction of the corresponding ground line 300. Further, each of two sides, which are perpendicular to the extension direction of the corresponding ground line 300, of each of the adsorption electrodes 513 is connected to one of the connection walls 520 through a plurality of the first connection bars 512.

In the present embodiment, each of the adsorption electrodes 513 corresponds to two of the connection walls 520, and the lengthwise directions of the two connection walls 520 are perpendicular to the extension direction of the corresponding ground line 300, respectively. Further, the two connection walls 520 are connected to both sides of the adsorption electrode 513, such that the length of each of the first connection bars 512 is not limited by the width of the corresponding ground line 300. As such, the sensitivity of the phase shifter is improved by extending the length of each of the first connection bars 512, and meanwhile, the rightly opposite area between each of the adsorption electrodes 513 and the corresponding ground line 300 can be ensured to be sufficiently large.

To further improve the phase adjustment capability of the phase shifter, in an embodiment as shown in FIGS. 1-2, 4-9, and 12A-13, the phase shifter may further include a first switch unit 10 disposed on the substrate 100, and the first switch unit 10 may provide a bias voltage signal to the film bridge 500 upon receiving a first control signal.

The phase shifter according to the present embodiment further includes the first switch unit 10 disposed on the substrate 100, and the first switch unit 10 is capable of performing individual control on a potential of the film bridge 500 of the phase shifter in which the first switch unit 10 is disposed, under the control of the first control signal. Thus, when a plurality of phase shifters according to an embodiment of the present disclosure respectively serve as a plurality of phase shifting units to form a complex control circuit (e.g., an array antenna), the first control signal may be sent to each first switch unit 10, so as to independently control operation states of different phase shifting units (i.e., the phase shifters according to an embodiment of the present disclosure), accurately adjust the phase shifting degree, and implement circuit level control on a target device.

A circuit structure of the first switch unit 10 is not particularly limited in an embodiment of the present disclosure. For example, as an optional embodiment of the present disclosure, as shown in FIG. 1, the first switch unit 10 has a bias voltage input terminal (e.g., an upper end of the first switch unit 10 in FIG. 1), a first output terminal (e.g., a left end of the first switch unit 10 in FIG. 1), and a first control terminal (e.g., a right end of the first switch unit 10 in FIG. 1). The bias voltage input terminal may receive a bias voltage signal. The first output terminal is electrically connected to the film bridge 500 through a bias voltage output line 800, and the first switch unit 10 is capable of electrically connecting the first output terminal and the bias voltage input terminal to each other when the first control terminal receives the first control signal, thereby transmitting the bias voltage signal to the film bridge 500.

To simplify a manufacturing process, in an embodiment, the bias voltage output line 800 and the film bridge 500 are disposed in a same layer and include a same material, i.e., are formed by a same patterning process, as shown in FIG. 1.

For example, the circuit structure of the first switch unit 10 may be implemented by a thin film transistor (TFT). For example, the first switch unit 10 includes (or is) a first switch transistor. A first electrode (e.g., a source) of the first switch transistor serves as the bias voltage input terminal of the first switch unit 10. A second electrode (e.g., a drain) of the first switch transistor serves as the first output terminal of the first switch unit 10 (i.e., the second electrode of the first switch transistor is electrically connected to the film bridge 500 through the bias voltage output line 800). A control electrode (e.g., a gate) of the first switch transistor serves as the first control terminal of the first switch unit 10. The first switch transistor is capable of electrically connecting the first electrode and the second electrode to each other when the control electrode of the first switch transistor receives the first control signal (e.g., a signal that turns on or off the first switch transistor).

The inventors of the present inventive concept have further found in researches that, the existing phase shifter often has a hysteresis effect caused by residual charges in frequent charging and discharging processes, which results in the problem of accuracy reduction caused by unequal initial capacitances of phase shifting units during their operation processes.

In order to solve at least the above technical problem and improve the control accuracy of the phase shifter, as an exemplary embodiment of the present disclosure as shown in FIGS. 1, and 4-7, the phase shifter further includes a second switch unit 20 disposed on the substrate 100. The second switch unit 20 may electrically connect the signal line 200 to the film bridge 500 when receiving a second control signal. Specifically, as shown in FIGS. 1-2, 4-9, and 12A-13, the second switch unit 20 may be electrically connected to the signal line 200 through a connection line 900 (which may be electrically isolated from the corresponding ground line 300 by a corresponding insulating isolation layer 400), and electrically connected to the film bridge 500 through another connection line 900 and the bias voltage output line 800.

In the phase shifter according to the present embodiment, the second switch unit 20 is capable of electrically connecting the signal line 200 and the film bridge 500 upon receiving the second control signal, thereby forming a residual charge discharging loop between the signal line 200 and the film bridge 500. Therefore, the hysteresis effect caused by residual charges in the frequent charging and discharging processes of the phase shifting units (i.e., the phase shifters according to an embodiment of the present disclosure) is avoided, and the uniformity of the initial capacitances of the phase shifting units in their operation processes is improved, thereby further improving the control precision of the phase shifter on the phase of the radio frequency signal. For example, similar to the first switch unit 10, the second switch unit 20 may be a thin film transistor. For example, the second switch unit 20 includes a second switch transistor.

As a second aspect of the present disclosure, there is also provided a method for manufacturing a phase shifter, as shown in FIGS. 14(*a*)-14(*f*). The method may include the following steps S1 to S3.

In step S1, the substrate 100 is provided as shown in FIG. 14(*a*). For example, the substrate 100 may be made of glass, ceramic, quartz, or the like.

In step S2, the signal line 200 and the two ground lines 300 are formed on the substrate 100, such that the two ground lines 300 are located on both sides of the signal line 200 and spaced apart from the signal line 200, respectively, as shown in FIG. 14(*a*). For example, each of the signal line 200 and the two ground lines 300 may be made of a metal such as aluminum, copper, silver, gold, or the like.

In step S3, at least one film bridge 500, each of which includes the plurality of connection walls 520 and the bridge floor structure 510 that is disposed opposite to the substrate 100, is formed. The plurality of connection walls 520 are respectively disposed on the two ground lines 300, and the bridge floor structure 510 includes the phase shifting electrode 511 and at least one pair of adsorption electrodes 513 connected to both sides of the phase shifting electrode 511. The phase shifting electrode 511 is disposed opposite to the signal line 200. Two adsorption electrodes 513 in a same pair of adsorption electrodes 513 are disposed opposite to the two ground lines 300, respectively, and are connected to the connection walls 520 on the corresponding ground lines 300, respectively, as shown in FIGS. 14(*b*)-14(*e*) and FIGS. 1-2. For example, the film bridge 500 may be made of a metal such as aluminum, copper, silver, gold, or the like.

In the phase shifter manufactured by the method for manufacturing a phase shifter according to the present embodiment, both sides of the phase shifting electrode 511 of the bridge floor structure 510 are connected with the absorption electrodes 513 arranged in pairs, and the two absorption electrodes 513 correspond to positions of the two ground lines 300, respectively. Thus, after a bias voltage signal is provided to the film bridge 500, the two absorption electrodes 513 on the two sides of the phase shifting electrode 511 are adsorbed by the corresponding ground lines 300, respectively, and the film bridge 500 is driven to be pulled down by the electric field that is between each absorption electrode 513 and the corresponding ground line 300 and is located at a corresponding end of the film bridge 500, thereby changing the distance between the bridge floor structure 510 and the signal line 200. In the process of the pull-down, a deformation of the film bridge 500 mainly occurs at a portion of the bridge floor at each of the adsorption electrodes 513, and the displacement of the center point of the bridge floor and the bias voltage have a good linear relationship therebetween, such that the displacement of the pull-down of the bridge floor of the film bridge 500 can be accurately controlled by changing the magnitude of the bias voltage, and continuous phase adjustment can be realized by a single phase shifter. Compared with the scheme that a switch unit of the traditional MEMS phase shifter can only be switched between the turn-on state and the turn-off state (i.e., the phase of the radio frequency signal can only be adjusted by a fixed amplitude), the method for manufacturing a phase shifter according to the present embodiment greatly improves the phase shifting capability of the phase shifter.

In order to improve the safety of the phase shifter and prevent electric leakage from occurring due to the film bridge 500 being in contact with each ground line 300, in an embodiment, as shown in FIG. 14(*b*), the method further includes, prior to step S3: forming the insulating isolation layer 400 on each of the ground lines 300. For example, the insulating isolation layer 400 may be made of an organic insulating material such as a resin or an inorganic insulating material such as $SiO_2$.

A method for forming the suspended bridge floor of the film bridge 500 is not particularly limited in an embodiment of the present disclosure.

For example, step S3 may optionally include the following steps S31 and S32.

In step S31, a sacrificial layer 700 is formed on the substrate 100, the signal line 200, and each of the insulating isolation layers 400 to expose a portion of each of the insulating isolation layers 400, and the at least one film bridge 500 is formed on the sacrificial layer 700 and on the two ground lines 300 (i.e., and on the exposed portions of the two insulating isolation layers 400 respectively located on the two ground lines 300), as shown in FIGS. 14(*c*)-14(*d*). For example, the sacrificial layer 700 may be made of a photoresist.

In step S32, the sacrificial layer 700 is removed (or released), as shown in FIGS. 14(*d*)-14(*e*). For example, the sacrificial layer 700 may be removed by an etching process.

In other embodiments of the present disclosure, the phase shifter may alternatively be manufactured by a bonding process. That is, an inverted film bridge 500 is formed on other substrate separately, and the other substrate and the substrate on which the signal line 200 and the ground lines 300 are formed (as shown in FIG. 14(*b*)) are aligned with each other and assembled into a cell (e.g., a phase shifter), such that the connection walls of the film bridge 500 are connected to the corresponding ground lines 300 (specifically, to the insulating isolation layers 400 on the corresponding ground lines 300), respectively. Thereafter, the other substrate previously used for forming the film bridge 500 is removed.

It should be understood that, the manufacturing method may further include a step of forming another component of the phase shifter according to any one of the foregoing embodiments of the present disclosure, in addition to steps S1-S32.

Figure 10:
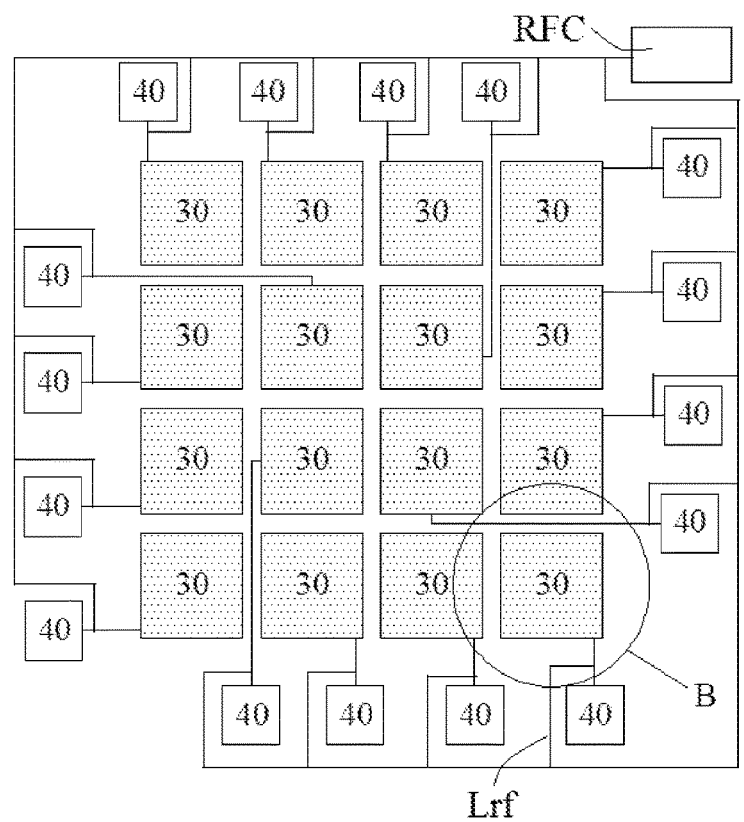
FIG. 10 is a schematic diagram showing a structure of an antenna device according to an embodiment of the present disclosure.
Figure 11:
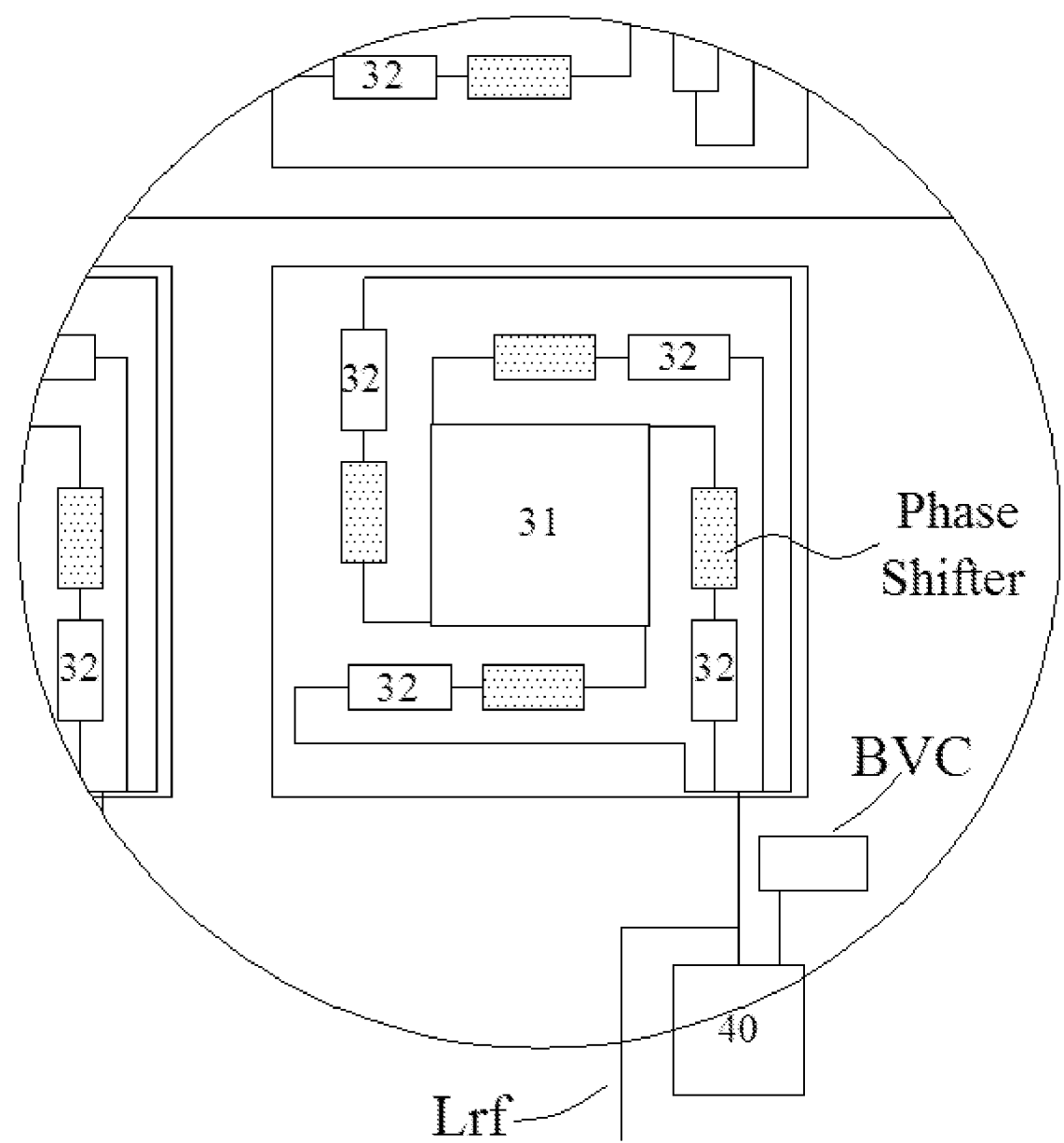
FIG. 11 is an enlarged view of the region B of FIG. 10.

As a third aspect of the present disclosure, there is provided an antenna device, as shown in FIGS. 10-11. The antenna device may include a plurality of antenna units 30 and a radio frequency signal supply circuit (which may be a conventional radio frequency signal supply circuit) RFC, and the plurality of antenna units 30 are arranged in an array along rows and columns of the array. Each of the antenna units 30 includes a radio frequency antenna (which may be a conventional radio frequency antenna) 31 and at least one phase shifter (e.g., at least one phase shifter provided by any one of the foregoing embodiments of the present disclosure) connected to the radio frequency antenna 31, as shown in FIG. 11. The radio frequency signal supply circuit RFC may supply a radio frequency signal to each radio frequency antenna 31 through each phase shifter of the antenna unit 30 including the radio frequency antenna 31 via a connection line Lrf. Each of the antenna units 30 further includes a bias voltage supply circuit (which may be a conventional bias voltage supply circuit) BVC for supplying a bias voltage to a capacitance adjustment component (e.g., the film bridge 500 and/or the signal line 200) in the corresponding phase shifter.

In the antenna device according to the present embodiment, both sides of the phase shifting electrode 511 of the film bridge 500 of each of the phase shifters are connected with the absorption electrodes 513 arranged in pairs, and the two absorption electrodes 513 correspond to positions of the two ground lines 300, respectively. Thus, after a bias voltage signal is provided to the film bridge 500, the two absorption electrodes 513 on the two sides of the phase shifting electrode 511 are adsorbed by the corresponding ground lines 300, respectively, and the film bridge 500 is driven to be pulled down by the electric field that is between each absorption electrode 513 and the corresponding ground line 300 and is located at a corresponding end of the film bridge 500, thereby changing the distance between the bridge floor structure 510 and the signal line 200. In the process of the pull-down, a deformation of the film bridge 500 mainly occurs at an end of the bridge floor at each of the adsorption electrodes 513, and the displacement of the center point of the bridge floor and the bias voltage have a good linear relationship therebetween, such that the displacement of the pull-down of the bridge floor of the film bridge 500 can be accurately controlled by changing the magnitude of the bias voltage, and continuous phase adjustment can be realized by a single phase shifter. Compared with the scheme that a switch unit of an antenna device including the traditional MEMS phase shifter can only be switched between the turn-on state and the turn-off state (i.e., the phase of the radio frequency signal can only be adjusted by a fixed amplitude), the present embodiment greatly improves a phase shifting capability of each phase shifter of the antenna device.

In order to improve the stability of the antenna device, in an embodiment as shown in FIGS. 10-11, the antenna device further includes a plurality of main switch units 40 in one-to-one correspondence with the plurality of antenna units 30 and connected to the plurality of antenna units 30, respectively, and each of the antenna units 30 further includes at least one sub-switch unit 32. For example, a plurality of phase shifters are in one-to-one correspondence with the plurality of sub-switch units 32, each phase shifter is connected in series to the corresponding sub-switch unit 32, and is connected with the corresponding main switch unit 40 through the corresponding sub-switch unit 32. The bias voltage supply circuit may send a control signal to at least one of the sub-switch units 32 through the corresponding main switch unit 40, such that the at least one of the sub-switch units 32 is selectively turned on, and the corresponding phase shifter can provide a radio frequency signal to the corresponding radio frequency antenna when the corresponding sub-switch unit is turned on.

In the present embodiment, an operation state of each antenna unit 30 is controlled by an independent main switch unit 40, and the plurality of phase shifters provided by any one of the foregoing embodiments of the present disclosure and connected in series with the respective sub-switch units 32 are disposed in each antenna unit 30. In consideration of the problem of possible poor uniformity of the MEMS phase shifters due to a complex manufacturing process thereof, in the present embodiment, the plurality of phase shifters are exemplarily disposed in each antenna unit, such that phase shifters with similar operation states and stable performance can be selected through debugging, and may be driven by the sub-switch units 32 under control of the corresponding main switch unit 40 to operate, thereby alleviating the problem of low yield of products each including an array of the phase shifters caused by poor uniformity of the MEMS phase shifters. As a result, the maintenance costs of the products are reduced, and the stability of a system is improved, thereby improving the feasibility of the application scheme of the MEMS phase shifters in an array.

A circuit structure of each main switch unit 40 or each sub-switch unit 32 is not particularly limited in an embodiment of the present disclosure. For example, each main switch unit 40 or each sub-switch unit 32 may optionally include (or be) a thin film transistor (TFT).

As another alternative embodiment of the present disclosure, each main switch unit 40 may be a MEMS switch, such as a single-pole double-throw switch or a single-pole multi-throw switch (e.g., a MEMS single-pole four-throw switch), to enable turn-on of a part of the plurality of phase shifters in each antenna unit 30 through the plurality of sub-switch units 32. Such a structure of each main switch unit 40 may be fabricated through a MEMS phase shifter fabrication process.

It is to be understood that the foregoing embodiments of the present disclosure may be combined with each other in a case of no explicit conflict.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A phase shifter, comprising: a substrate, a signal line on the substrate, ground lines in pairs on the substrate, and at least one film bridge, wherein,
    two ground lines of the ground lines are on two sides of the signal line and are spaced apart from the signal line, respectively, each film bridge comprises a plurality of connection walls and a bridge floor structure that is opposite to the substrate, the plurality of connection walls are on the two ground lines, respectively, the bridge floor structure comprises a phase shifting electrode and at least one pair of adsorption electrodes respectively connected to two sides of the phase shifting electrode, the phase shifting electrode is opposite to the signal line, two adsorption electrodes in each pair of adsorption electrodes are opposite to the two ground lines, respectively, and are respectively connected to the plurality of connection walls on the two ground lines.

2. The phase shifter according to claim 1, wherein the plurality of connection walls comprise two connection walls, the bridge floor structure further comprises a plurality of first connection bars, and each of the adsorption electrodes is connected to a corresponding connection wall through the plurality of first connection bars.

3. The phase shifter according to claim 2, wherein an edge of each of the adsorption electrodes proximal to the phase shifting electrode is aligned with an edge of a corresponding ground line proximal to the signal line in a direction perpendicular to the substrate, a lengthwise direction of each of the two connection walls is parallel to an extension direction of the corresponding ground line, and a dimension of each of the adsorption electrodes in a direction perpendicular to the extension direction of the corresponding ground line is greater than ⅓ of a width of the corresponding ground line and less than ⅔ of the width of the corresponding ground line.

4. The phase shifter according to claim 3, wherein each of the adsorption electrodes is connected to the corresponding connection wall through two first connection bars, each of the first connection bars extends in the direction perpendicular to the extension direction of the corresponding ground line, and a length of each of the first connection bars is 3 to 5 times a thickness of the corresponding connection wall.

5. The phase shifter according to claim 4, wherein the plurality of first connection bars have a same width.

6. The phase shifter according to claim 5, wherein a dimension of each of the connection walls in the extension direction of the corresponding ground line is 5 to 10 times the width of each of the first connection bars.

7. The phase shifter according to claim 2, wherein each of the adsorption electrodes is connected to the corresponding connection wall through three first connection bars.

8. The phase shifter according to claim 2, wherein a lengthwise direction of each of the two connection walls is parallel to an extension direction of a corresponding ground line, at least one accommodation notch is in an edge of each of the adsorption electrodes proximal to the corresponding connection wall, one end of each of the first connection bars is connected to the corresponding connection wall, and the other end thereof extends into the at least one accommodation notch and is connected to the adsorption electrode.

9. The phase shifter according to claim 8, wherein each of the first connection bars comprises a first bar-shaped portion, a second bar-shaped portion, and a third bar-shaped portion which extend in a direction perpendicular to an extension direction of a corresponding ground line and are sequentially arranged to be spaced apart from each other in the extension direction of the corresponding ground line, a first end of the first bar-shaped portion is connected to the corresponding connection wall, a second end of the first bar-shaped portion is connected to a first end of the second bar-shaped portion, a second end of the second bar-shaped portion is connected to a first end of the third bar-shaped portion, and a second end of the third bar-shaped portion is connected to the adsorption electrode.

10. The phase shifter according to claim 9, wherein each adsorption electrode is connected to the corresponding connection wall through two first connection bars, and two third bar-shaped portions of the two first connection bars are both outside two first bar-shaped portions of the two first connection bars.

11. The phase shifter according to claim 9, wherein each adsorption electrode is connected to the corresponding connection wall through two first connection bars, and two third bar-shaped portions of the two first connection bars are both between two first bar-shaped portions of the two first connection bars.

12. The phase shifter according to claim 8, wherein each of the first connection bars comprises a first connection portion, a first U-shaped portion, a second U-shaped portion, and a second connection portion, ends of which are connected to each other in sequence, the first connection portion and the second connection portion extend in a direction perpendicular to the extension direction of the corresponding ground line, an opening of the first U-shaped portion and an opening of the second U-shaped portion are directed towards the extension direction of the corresponding ground line, and the openings of the first U-shaped portion and the second U-shaped portion are directed towards opposite directions, respectively.

13. The phase shifter according to claim 8, wherein each adsorption electrode is connected to the corresponding connection wall through two first connection bars, each adsorption electrode has two accommodation notches in an edge of the adsorption electrode proximal to the corresponding connection wall, and the two accommodation notches are in one-to-one correspondence with the two first connection bars, and one end of each first connection bar is connected to the corresponding connection wall, and the other end of each first connection bar extends into a corresponding accommodation notch and is connected to the adsorption electrode.

14. The phase shifter according to claim 2, wherein a lengthwise direction of each of the two connection walls is parallel to an extension direction of a corresponding ground line, each of the ground lines comprises a ground-line main body and at least one ground electrode on a side of the ground-line main body proximal to the signal line, the at least one ground electrode is electrically connected to the ground-line main body, an edge of each adsorption electrode proximal to the phase shifting electrode extends beyond the ground-line main body, and the adsorption electrode is opposite to the at least one ground electrode.

15. The phase shifter according to claim 14, wherein an edge of each ground electrode is aligned with an edge of a corresponding adsorption electrode in a direction perpendicular to the substrate.

16. The phase shifter according to claim 1, wherein each film bridge has an axisymmetric structure, and a symmetry axis of each film bridge is perpendicular to an extension direction of each of the ground lines.

17. The phase shifter according to claim 1, wherein the plurality of connection walls comprise four connection walls, each of the adsorption electrodes is on a corresponding ground line through two of the four connection walls, a lengthwise direction of each of the connection walls is perpendicular to an extension direction of the corresponding ground line, and each of two sides, which are perpendicular to the extension direction of the corresponding ground line, of each adsorption electrode is connected to one of the connection walls through a plurality of first connection bars.

18. The phase shifter according to claim 1, wherein the phase shifting electrode overlaps at least a part of the signal line in a direction perpendicular to the substrate.

19. An antenna device, comprising: a plurality of antenna units and a radio frequency signal supply circuit, wherein,
each of the plurality of antenna units comprises a radio frequency antenna and at least one phase shifter connected with the radio frequency antenna, the radio frequency signal supply circuit is configured to supply a radio frequency signal to the radio frequency antenna through the at least one phase shifter, and each of the at least one phase shifter is the phase shifter according to claim 1; and
each of the plurality of antenna units further comprises a bias voltage supply circuit configured to supply a bias voltage to the film bridge of each of the at least one phase shifter.

20. The antenna device according to claim 19, further comprising a plurality of main switch units in one-to-one correspondence with and respectively connected to the plurality of antenna units, wherein, each of the plurality of antenna unit further comprises at least one sub-switch unit in one-to-one correspondence with the at least one phase shifter, each phase shifter is connected to a corresponding main switch unit through a corresponding sub-switch unit, the bias voltage supply circuit is configured to send a control signal to the at least one sub-switch unit through the corresponding main switch unit to cause the at least one sub-switch unit to be selectively turned on, and each phase shifter is configured to provide the radio frequency signal to a corresponding radio frequency antenna when the corresponding sub-switch unit is turned on.

* * * * *